(12) United States Patent
Hodono (10) Patent No.: US 7,906,355 B2
(45) Date of Patent: Mar. 15, 2011

(54) OPTICAL WAVEGUIDE DEVICE PRODUCTION METHOD, OPTICAL WAVEGUIDE DEVICE PRODUCED BY THE METHOD, AND OPTICAL WAVEGUIDE CONNECTION STRUCTURE TO BE USED FOR THE DEVICE

(75) Inventor: Masayuki Hodono, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 169 days.

(21) Appl. No.: 12/273,084

(22) Filed: Nov. 18, 2008

(65) Prior Publication Data

US 2009/0127577 A1    May 21, 2009

Related U.S. Application Data

(60) Provisional application No. 61/013,677, filed on Dec. 14, 2007.

(30) Foreign Application Priority Data

Nov. 20, 2007 (JP) ................................ 2007-300594

(51) Int. Cl.
*H01L 33/00* (2010.01)
(52) U.S. Cl. .................. 438/27; 257/99; 257/E33.067
(58) Field of Classification Search .................. 257/98
See application file for complete search history.

(56) References Cited

U.S. PATENT DOCUMENTS

| 4,433,898 | A | | 2/1984 | Nasiri | |
| 4,941,255 | A | * | 7/1990 | Bull ............................... | 29/833 |
| 6,170,996 | B1 | | 1/2001 | Miura et al. | |
| 6,188,118 | B1 | | 2/2001 | Severn | |
| 6,309,566 | B1 | | 10/2001 | Muller et al. | |
| 6,312,624 | B1 | * | 11/2001 | Kropp ........................... | 264/1.25 |
| 6,735,023 | B2 | * | 5/2004 | Schunk .......................... | 359/808 |
| 6,932,516 | B2 | * | 8/2005 | Ouchi et al. ..................... | 385/88 |

(Continued)

FOREIGN PATENT DOCUMENTS

DE    19711138 A1    9/1998

(Continued)

OTHER PUBLICATIONS

European Search Report dated Feb. 17, 2009, issued in corresponding European Patent Application No. 08020117.1.

(Continued)

*Primary Examiner* — Benjamin P Sandvik
(74) *Attorney, Agent, or Firm* — Westerman, Hattori, Daniels & Adrian, LLP (57) ABSTRACT

An optical waveguide device production method which ensures that a receptacle structure can be easily and highly accurately produced in a single step, an optical waveguide device produced by the method, and an optical waveguide connection structure to be used for the optical waveguide device. The optical waveguide device includes a light emitting element (21) mounted on an upper surface of a board (20), and a core layer (29) which seals the light emitting element (21). The core layer (29) has an optical waveguide insertion recess (25) and an optical coupling lens (27) unitarily formed in a portion thereof opposed to a light emitting surface of the light emitting element (21). One end of an optical waveguide (30) is inserted in the recess (25) and fixed by a sealing resin (31). Thus, the optical waveguide (30) is optically coupled with a light emitting/receiving point of the light emitting element (21) in the core layer (29).

5 Claims, 4 Drawing Sheets

U.S. PATENT DOCUMENTS

| | | | |
|---|---|---|---|
| 7,095,109 B2 * | 8/2006 | Silverbrook | 257/704 |
| 7,491,106 B2 | 2/2009 | Seki et al. | |
| 2003/0007749 A1 | 1/2003 | Hurt et al. | |
| 2004/0061956 A1 | 4/2004 | Schunk et al. | |
| 2004/0085609 A1 | 5/2004 | Fries | |
| 2006/0091418 A1 * | 5/2006 | Chew | 257/100 |
| 2007/0114547 A1 * | 5/2007 | Fujita et al. | 257/98 |

FOREIGN PATENT DOCUMENTS

| | | |
|---|---|---|
| DE | 102007044555 A1 | 1/2009 |
| EP | 1031860 A2 | 8/2000 |
| GB | 2316225 A | 2/1998 |
| JP | 55-24404 A | 2/1980 |
| JP | 4-2179 A | 1/1992 |
| JP | 10-307237 A | 11/1998 |
| JP | 2000-110176 A | 4/2000 |
| JP | 2000-243980 A | 9/2000 |
| JP | 2000-515687 T | 11/2000 |
| JP | 2005-24617 A | 1/2005 |
| JP | 2005-55796 A | 3/2005 |
| JP | 2006-154553 A | 6/2006 |
| JP | 2007-173562 A | 7/2007 |
| WO | 98/06141 A1 | 2/1998 |

OTHER PUBLICATIONS

European Search Report dated Nov. 12, 2009, issued in corresponding European Patent Application No. 08020117.1.

* cited by examiner

PRIOR ART

OPTICAL WAVEGUIDE DEVICE PRODUCTION METHOD, OPTICAL WAVEGUIDE DEVICE PRODUCED BY THE METHOD, AND OPTICAL WAVEGUIDE CONNECTION STRUCTURE TO BE USED FOR THE DEVICE

RELATED APPLICATIONS

This application claims the benefit of U.S. Provisional Application No. 61/013,677, filed Dec. 14, 2007, which is hereby incorporated by reference.

BACKGROUND OF THE INVENTION

1. Field of the Invention

The present invention relates to a production method for an optical waveguide device which is widely used for optical communications, optical information processing and other general optics, an optical waveguide device produced by the method, and an optical waveguide connection structure to be used for the device.

2. Description of the Related Art

Optical waveguide devices are generally configured such that light emitted from a light emitting element is transmitted through an optical waveguide or the light transmitted through the optical waveguide is received by a light receiving element for optical coupling. It is important to align the optical axis of the optical waveguide with the optical axis of the light emitting element or the light receiving element for the coupling. This requires high positioning accuracy. Recently, an optical waveguide device (optical module) having a receptacle structure which facilitates the positioning has been proposed. This optical module is generally used for optical communications (see JP-A-2006-154553).

Figure 5:
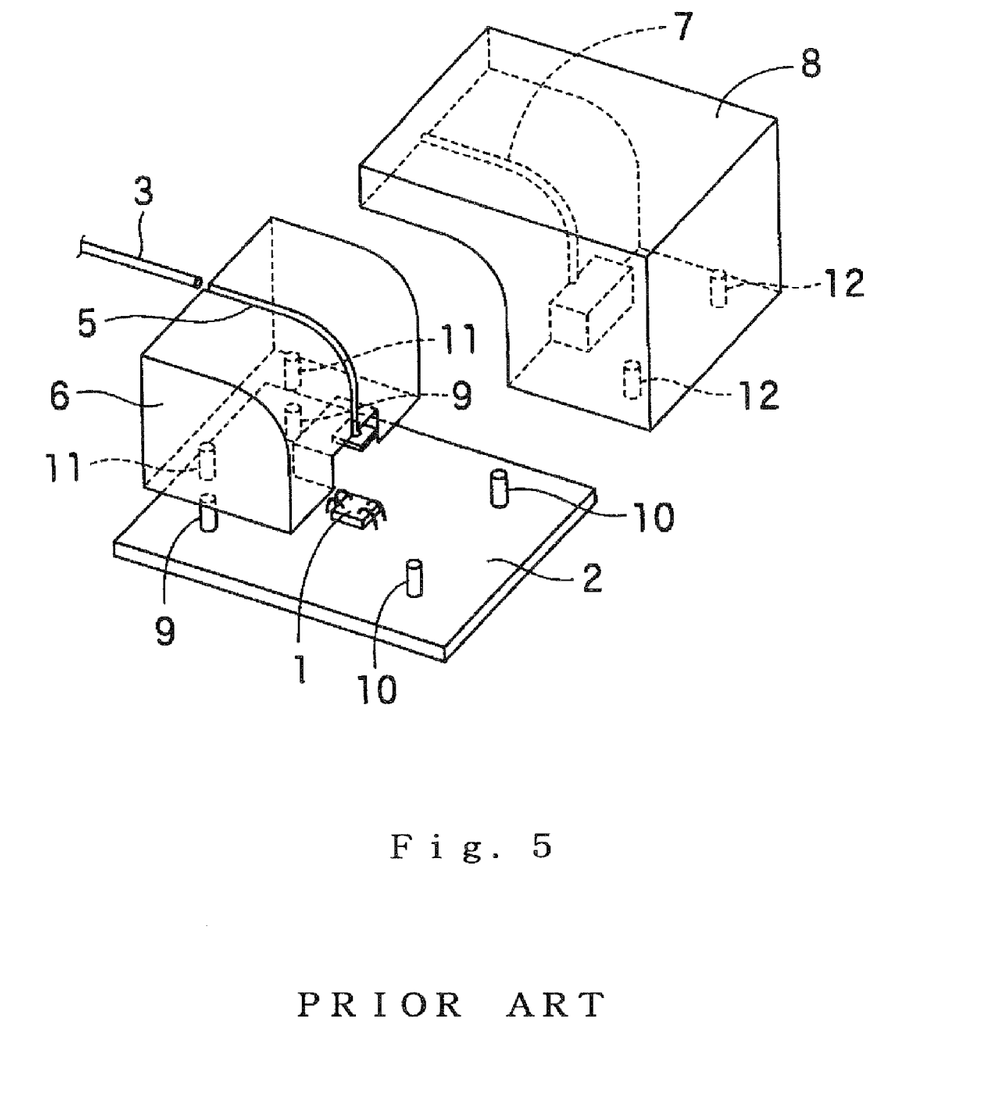
FIG. 5 is an explanatory diagram illustrating an example of a prior-art optical waveguide device having a receptacle structure.

For example, as shown in FIG. 5, the optical module disclosed in JP-A-2006-154553 includes a board 2 mounted with an optical element 1 such as a surface emitting element, and a receptacle which is capable of positioning a flexible optical waveguide 3 with respect to the optical element 1 with the optical axes of the flexible optical waveguide and the optical element 1 aligned with each other.

The receptacle includes a first receptacle 6 and a second receptacle 8 respectively having a lower groove 5 and an upper groove 7 which cooperatively serve as a guide for positioning the flexible optical waveguide 3. The first receptacle 6 and the second receptacle 8 are unitarily combined with each other by bringing guide pins 9 and 10 projecting upright from an upper surface of the board 2 into engagement with guide holes 11 and 12 formed in lower surfaces of the first and second receptacles 6 and 8, respectively.

However, the production of the receptacle structure of the optical module requires a complicated process including the steps of preparing the first receptacle 6 and the second receptacle 8, and combining these two components with each other on the board 2. Further, the optical element 1 and the flexible optical waveguide 3 are positioned with respect to each other via the combined receptacle structure, so that the overall accuracy is dependent upon the cumulative processing errors and the cumulative assembling errors of the respective components. This makes it difficult to control the accuracy.

SUMMARY OF THE INVENTION

In view of the foregoing, it is an object of the present invention to provide an excellent optical waveguide device production method which ensures that a receptacle structure can be easily and highly accurately produced in a single step, to provide an optical waveguide device produced by the method, and to provide an optical waveguide connection structure to be used for the optical waveguide device.

MEANS FOR SOLVING THE PROBLEMS

According to a first aspect of the present invention to achieve the aforementioned object, there is provided an optical waveguide device production method, which includes the steps of: mounting a light emitting/receiving element on an upper surface of a board; enclosing the mounted light emitting/receiving element with a mold; filling a core material in the mold and curing the core material to form a core layer, whereby the light emitting/receiving element is sealed in the core layer and an optical waveguide insertion recess and an optical coupling lens are unitarily formed in a portion of the core layer opposed to a light emitting/receiving surface of the light emitting/receiving element; demolding the resulting product; and inserting one end of an optical waveguide into the optical waveguide insertion recess of the core layer, and fixing the one end of the optical waveguide in the optical waveguide insertion recess by sealing the one end of the optical waveguide with a resin.

According to a second aspect of the present invention, there is provided an optical waveguide device production method, in which the mold is a transparent mold prepared by using at least one of quartz glass and silicon, and the mold is placed so that the optical coupling lens to be formed by the mold is centered coaxially with a light emitting/receiving point of the light emitting/receiving element while the inside of the mold is viewed through the mold in the optical waveguide device production method.

According to a third aspect of the present invention, there is provided an optical waveguide device production method, in which the mold is a metal mold, and the mold and the board are respectively provided with alignment marks, which are aligned with each other so that the optical coupling lens to be formed by the mold is centered coaxially with the light emitting/receiving point of the light emitting/receiving element.

According to a fourth aspect of the present invention, there is provided an optical waveguide device produced by the production method according to the first aspect, the optical waveguide device including: a light emitting/receiving element mounted on an upper surface of a board; a core layer which seals the light emitting/receiving element, the core layer having an optical waveguide insertion recess and an optical coupling lens unitarily formed in a portion thereof opposed to a light emitting/receiving surface of the light emitting/receiving element; and an optical waveguide having one end inserted in the recess of the core layer and sealed with a resin to be fixed in the recess of the core layer, and optically coupled with a light emitting/receiving point of the light emitting/receiving element in the core layer.

According to a fifth aspect of the present invention, there is provided an optical waveguide connection structure to be used for the optical waveguide device according to the fourth aspect, the optical waveguide connection structure including a core layer which seals a light emitting/receiving element mounted on an upper surface of a board, the core layer having an optical waveguide insertion recess and an optical coupling lens unitarily formed in a portion thereof opposed to a light emitting/receiving surface of the light emitting/receiving element, wherein one end of an optical waveguide is inserted in the recess of the core layer and sealed with a resin to be fixed in the recess of the core layer, and the optical waveguide is optically coupled with the light emitting/receiving element in the core.

The inventor of the present invention conducted intensive studies to provide a receptacle structure which ensures easy and highly accurate positioning of the light emitting/receiving element and the optical waveguide for optical coupling. As a result, the inventor found that the aforementioned object can be achieved by simultaneously forming the lens and the optical waveguide insertion recess required for the receptacle structure when the light emitting/receiving element is sealed with a resin for protection thereof from an external force. Thus, the inventor attained the present invention.

In the inventive optical waveguide device production method, as described above, the lens and the optical waveguide insertion recess required for the receptacle structure are simultaneously formed when the light emitting/receiving element is sealed with the resin for the protection of the element from the external force. Therefore, the receptacle structure can be easily and highly accurately produced in the single step. Thus, the optical waveguide device production method is advantageous in that production costs and time are significantly reduced without the need for the conventionally required complicated process.

Where the mold is the transparent mold prepared by using at least one of quartz glass and silicon in the production method, the mold is placed so that the optical coupling lens to be formed by the mold is centered coaxially with the light emitting/receiving point of the light emitting/receiving element while the inside of the mold is viewed through the mold. In this case, the production method is advantageous in that the centering is easily achieved when the mold is placed.

Where the mold is the metal mold in the production method, the mold and the board are respectively provided with the alignment marks, which are aligned with each other so that the optical coupling lens to be formed by the mold is centered coaxially with the light emitting/receiving point of the light emitting/receiving element. In this case, the production method is advantageous in that the centering is easily achieved when the mold is placed.

Further, the inventive optical waveguide device has a simplified structure with the light emitting/receiving element and the optical waveguide sealed in the core layer and yet the optical axes of the light emitting/receiving element and the optical waveguide are accurately aligned with each other for optical coupling. Therefore, the optical waveguide device can transmit high intensity light.

The optical waveguide connection structure to be used for the optical waveguide device is advantageous in that easy and highly efficient transmission of light can be achieved at lower costs with a reduced light coupling loss.

DETAILED DESCRIPTION

A production method for an optical waveguide device including a light emitting element and an optical waveguide optically coupled with each other will hereinafter be described by way of embodiment.

Figure 1:
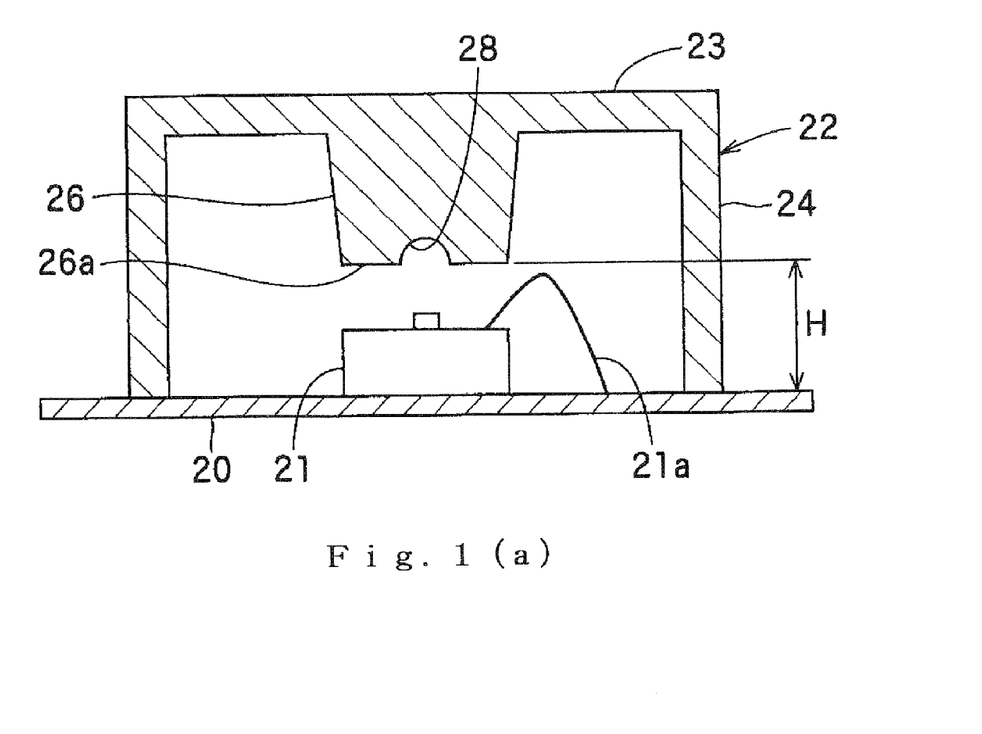
FIGS. 1(a) and 1(b) are explanatory diagrams schematically showing a process for producing an optical waveguide device according to one embodiment of the present invention.

In this embodiment, as shown in FIG. 1(a), a planar board 20 is first prepared, and a light emitting element 21 is mounted at a predetermined position on an upper surface of the board 20.

Exemplary materials for the board 20 include glass, quartz glass, silicon, resins and metals. The thickness of the board 20 is properly determined according to the board material and the required properties of the board. Where the board 20 is a flexible printed circuit (FPC) board based on a polyester (PET) resin, a polycarbonate (PC) resin or a polyethylene naphthalate (PEN) resin, for example, the board 20 typically has a thickness of 30 to 300 µm. Where the board 20 is a rigid board based on a glass board or a quartz board, for example, the board 20 typically has a thickness of 1 to 5 mm.

Examples of the light emitting element 21 include a light emitting diode (LED), a laser diode (LD) and a surface emitting laser (VCSEL). The light emitting element 21 is mounted on the board 20 by a wire bonding method or the like.

Then, the mounted light emitting element 21 is enclosed with a core layer formation mold 22 (having a rectangular plan shape). The mold 22 has a ceiling surface 23 and side surfaces 24. The mold 22 has a projection 26 provided on a portion of the ceiling surface 23 opposed to a light emitting surface of the light emitting element 21 for forming an optical waveguide insertion recess 25 as shown in FIG. 1(b), and a semispherical indentation 28 provided in a distal surface 26a of the projection 26 for forming an optical coupling lens 27 as shown in FIG. 1(b).

Exemplary materials for the mold 22 include metals, resins, silicon and quartz glass. Particularly, it is desirable that the mold 22 is a transparent mold such as of quartz glass or silicon. That is, active alignment can be achieved by viewing the light emitting element 21 from above through the transparent mold 22 to accurately position the mold 22 with respect to the light emitting element 21 so that the optical axis of the lens to be formed by the semispherical indentation 28 of the mold 22 is aligned with the optical axis of the light emitting element 21.

Where an opaque mold such as of a metal is used as the mold 22, for example, the mold 22 and the board 20 are respectively provided with alignment marks, and active alignment is achieved by picking up an image of the alignment marks from a back side of the board 20. In this case, it is desirable that the mold 22 is directly engraved with the alignment mark and the board 20 is formed with the alignment mark by printing or Cu plating.

Figure 2:
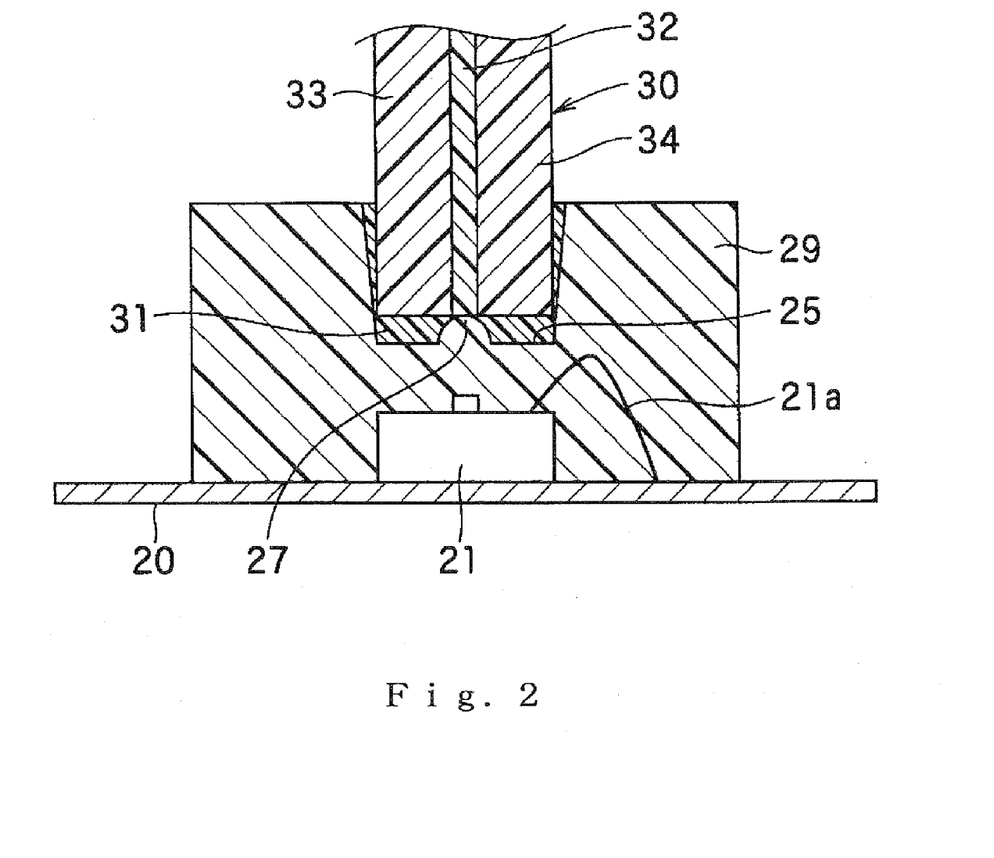
FIG. 2 is an explanatory diagram schematically showing the optical waveguide device production process.

The projection 26 of the mold 22 for forming the optical waveguide insertion recess 25 is configured such that the recess 25 to be formed has a tapered slit shape. Therefore, when a film-shaped optical waveguide 30 is inserted into the recess 25, as shown in FIG. 2, the optical waveguide 30 is fitted in the recess 25 with tolerance. Even if the optical waveguide 30 has slight variations in thickness, the variations are accommodated by the light collecting effect of the lens 27 to be described later.

The height H of the distal surface 26a of the projection 26 should be determined such that bonding wires 21a of the light emitting element 21 do not contact the distal surface 26a. This is because the distal surface 26a of the projection 26, if in contact with the bonding wires 21a, would press and break the bonding wires 21a.

Where the light emitting element 21 has an approximate body size of 200 μm (height)×300 μm (width)×300 μm (length), the mold 22 preferably has a height (internal height) of not greater than 10 mm, a width of not greater than about 20 mm and a length of not greater than about 20 mm. The height (H) of the distal surface 26a of the projection 26 is preferably not less than 400 μm for prevention of the contact with the bonding wires 21a.

Then, a core material is filled in the mold 22, and cured. Thus, a core layer 29 is formed, and then demolded. As shown in FIG. 1(b), a molded product produced in this manner is such that the light emitting element 21 is sealed in the core layer 29, which has the optical waveguide insertion recess 25 formed in an upper portion thereof as having the tapered slit shape and the optical coupling lens 27 having the light collecting effect.

The core material may be any of those commonly used for the optical waveguide. Examples of the core material include photosensitive resins such as photosensitive epoxy resins, photosensitive polyimide resins, photosensitive polyamide resins and photosensitive silicone resins, and thermosetting resins such as non-photosensitive epoxy resins and polyimide resins, which may be each used in the form of a varnish prepared by dissolving the resin in a solvent. Among these resins, the photosensitive epoxy resins are preferred.

Where a photosensitive resin is used as the core material, the core material is typically cured through spot irradiation with ultraviolet radiation. The dose of the ultraviolet radiation is typically 100 to 5000 $mJ/cm^2$, preferably 2000 to 3000 $mJ/cm^2$. The irradiation period is 1 to 3 seconds. Where a thermosetting resin such as a polyimide resin is used as the core material, the core material is typically cured through a heat treatment at 300 to 400° C. for 60 to 180 minutes.

In turn, a sealing resin material is injected into the optical waveguide insertion recess 25, and cured with the optical waveguide 30 being inserted in the recess 25. Thus, the optical waveguide 30 is fixed. This state is shown in FIG. 2, in which a reference numeral 31 denotes the cured sealing resin.

The sealing resin material may be any of cladding layer materials conventionally used for the optical waveguide. Examples of the sealing resin material include photosensitive resins such as photosensitive epoxy resins, photosensitive polyimide resins, photosensitive polyamide resins and photosensitive silicone resins, and thermosetting resins such as non-photosensitive epoxy resins and polyimide resins, which may be each used in the form of a varnish prepared by dissolving the resin in a solvent. Among these resins, the photosensitive epoxy resins are preferred. However, the sealing resin 31 preferably has a lower refractive index than the core layer 29 in order to minimize the loss of light emitted through the core layer 29.

Where a photosensitive resin is used as the sealing resin material, the sealing resin material is typically cured through spot irradiation with ultraviolet radiation. The dose of the ultraviolet radiation is typically 100 to 5000 $mJ/cm^2$, preferably 2000 to 3000 $mJ/cm^2$. The irradiation period is 1 to 5 seconds. Where a thermosetting resin such as a polyimide resin is used as the sealing resin material, the sealing resin material is typically cured through a heat treatment at 300 to 400° C. for 60 to 180 minutes.

The optical waveguide 30 to be inserted in the optical waveguide insertion recess 25 includes band-shaped films 33, 34 serving as cladding layers, and a longitudinally extending flexible core layer 32 sandwiched between the films 33, 34 and unitarily combined with the films 33, 34. A typical example of the optical waveguide is a laminate film including layers formed of a polyimide resin, a polyamide resin and/or an epoxy resin having refractive indexes properly adjusted. The optical waveguide preferably has an overall thickness of about 0.1 to about 2 mm.

The optical waveguide device thus produced is capable of transmitting high intensity light, because the light emitting element 21 and the optical waveguide 30 are highly accurately positioned with respect to each other with the optical axes thereof aligned with each other for optical coupling.

The optical waveguide device production method described above is practically effective, because the high quality optical waveguide device can be easily produced in a short time.

Figure 3:
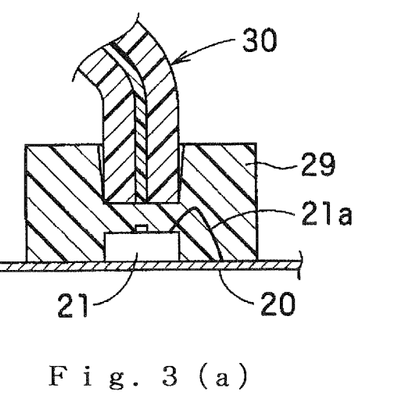
FIGS. 3(a) and 3(b) are explanatory diagrams schematically showing the mounting arrangements of the optical waveguide device.

In the embodiment described above, the flexible film-shaped optical waveguide 30 is used. Therefore, the film-shaped optical waveguide 30 connected to the board 20 can be routed in any direction from a mounting surface of the board 20 as shown in FIG. 3(a). Even if the optical waveguide 30 is not flexible, as shown in FIG. 3(b), the optical waveguide 30 can be mounted in any desired orientation (in a vertical orientation in FIG. 3(b)) by using a flexible FPC board as the board 20. By thus using flexible materials for at least one of the board 20 and the optical waveguide 30, the optical waveguide device can be mounted in any arrangement required for a given application.

Figure 4:
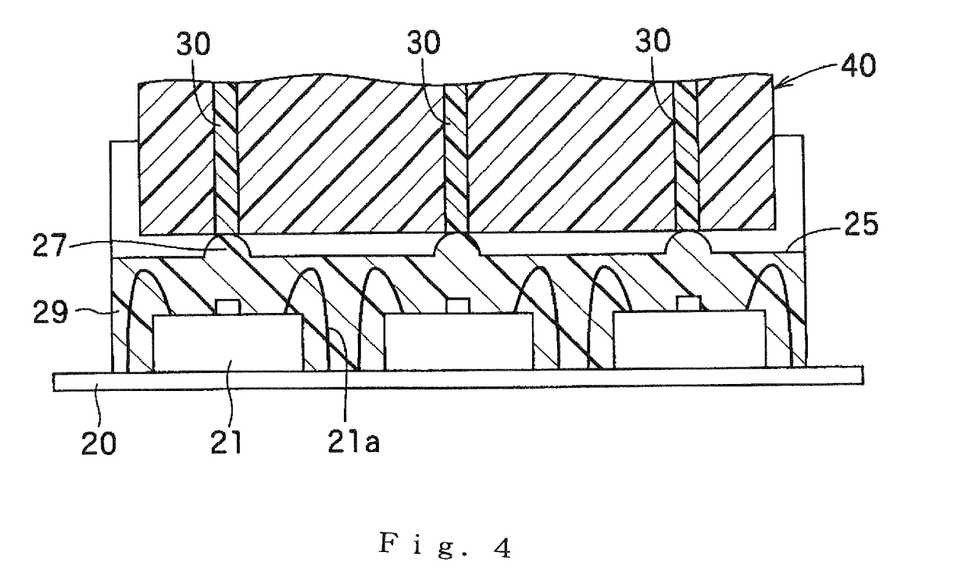
FIG. 4 is an explanatory diagram schematically illustrating an optical waveguide device according to another embodiment of the present invention.

In the embodiment described above, the single optical waveguide 30 is connected to the single light emitting element 21. However, as shown in FIG. 4, a board 20 mounted with a plurality of light emitting elements 21 arranged at a predetermined pitch may be prepared, and a corresponding number of optical waveguides 30 bundled in parallel relation into an optical waveguide set 40 may be respectively connected to the light emitting elements 21. It is noted that FIG. 4 is a sectional view taken along a sectional plane different by 90 degrees from the sectional plane in FIG. 2. A sealing resin 31 (see FIG. 2) in optical waveguide insertion recesses 25 is not shown in FIG. 4.

In the embodiment described above, the optical waveguide device is adapted to input light emitted from the light emitting element 21 into the core layer 32 of the film-shaped optical waveguide 30 for optical coupling. Alternatively, the optical waveguide device according to the present invention may be adapted to input light outputted from the core layer of the optical waveguide into a light receiving element for optical coupling.

Next, an inventive example will be described. However, it should be understood that the invention be not limited to the example.

EXAMPLE

Preparation of Mold

A glass mold was prepared, which was configured to allow the optical waveguide insertion recess to have an opening width of 1 mm and a bottom width of 0.15 mm and to allow the optical coupling lens to have a diameter of 0.1 mm. The mold was engraved with an alignment mark.

Preparation of Core Material

A core material was prepared by dissolving 70 parts by weight of bisphenoxyethanolfluorene diglycidyl ether (Component A), 30 parts by weight of 1,3,3-tris{4-[2-(3-oxetanyl)] butoxyphenyl}butane and 0.5 part by weight of a 50% propione carbonate solution of 4,4-bis[di(β-hydroxyethoxy)

phenylsulfinio]phenylsulfide bishexafluoroantimonate (photoacid generator, Component B) in 28 parts by weight of ethyl lactate.

Preparation of Sealing Resin Material for Optical Waveguide Insertion Recess

A sealing resin material was prepared by mixing together 35 parts by weight of bisphenoxyethanolfluorene diglycidyl ether (component A), 40 parts by weight of 3',4'-epoxycyclohexylmethyl-3,4-epoxycyclohexane carboxylate which is an alicyclic epoxy resin (CELLOXIDE 2021P manufactured by Daicel Chemical Industries, Ltd.), 25 parts by weight of (3', 4'-epoxycyclohexane)methyl-3',4'-epoxycyclohexyl-carboxylate (CELLOXIDE 2081 manufactured by Daicel Chemical Industries, Ltd.), and one part by weight of a 50% propione carbonate solution of 4,4-bis[di(β-hydroxyethoxy) phenylsulfinio] phenylsulfide-bis-hexafluoroantimonate (photo-acid generator: component B).

Production of Optical Waveguide Device

A surface emitting laser (SM85-2N001 available from Optowell Co., Ltd.) was mounted as a light emitting element on an FPC board having a board thickness of 38 μm by connecting rear side terminals thereof to the board with the use of a silver paste and connecting front side terminals thereof to the board via Au (gold) wires each having a diameter of 25 μm through the wire bonding method at 110° C.

In turn, the light emitting element mounted on the FPC board was enclosed with the mold, and the core material was filled in the mold. Then, the core material was cured through spot irradiation with ultraviolet radiation at 3000 mJ/cm$^2$. Thus, a core layer of a receptacle structure was formed which sealed the light emitting element.

Then, the core layer was demolded. After the sealing resin material was injected into the optical waveguide insertion recess of the core layer, one end of a film-shaped optical waveguide (having an overall thickness of 0.2 mm, a core layer thickness of 50 μm and a core layer width of 400 μm) was inserted into the optical waveguide insertion recess, and fixed in the optical waveguide insertion recess by curing the sealing resin material through spot irradiation with ultraviolet radiation at 3000 mJ/cm$^2$.

Thus, an optical waveguide device including the optical waveguide and the light emitting element optically coupled with each other via the receptacle structure was produced.

The amount of light transmitted through the optical waveguide was 90% of that observed where the optical waveguide was fully centered coaxially with the light emitting element through the active alignment. Therefore, the optical waveguide device had high quality with a little light loss associated with the optical coupling.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An optical waveguide device production method, comprising the steps of:
    mounting a light emitting/receiving element on an upper surface of a board;
    enclosing the mounted light emitting/receiving element with a mold;
    filling a core material in the mold and curing the core material to form a core body, whereby the light emitting/receiving element is sealed in the core body and an optical waveguide insertion recess of tapered slit shape for insertion of an optical waveguide having a longitudinally extending core layer sandwiched between band-shaped films serving as cladding layers and unitarily combined with the films and an optical coupling lens are unitarily formed in a portion of the core body opposed to a light emitting/receiving surface of the light emitting/receiving element;
    demolding the resulting product; and
    inserting one end of the optical waveguide into the optical waveguide insertion recess of the core body, and fixing the one end of the optical waveguide in the optical waveguide insertion recess in a state where the one of the optical waveguide being in contact with the optical coupling lens by sealing the one end of the optical waveguide with a resin.

2. An optical waveguide device production method as set forth in claim 1,
    wherein the mold is a transparent mold prepared by using at least one of quartz glass and silicon,
    wherein the mold is placed so that the optical coupling lens to be formed by the mold is centered coaxially with a light emitting/receiving point of the light emitting/receiving element while an inside of the mold is viewed through the mold.

3. An optical waveguide device production method as set forth in claim 1,
    wherein the mold is a metal mold,
    wherein the mold and the board are respectively provided with alignment marks, which are aligned with each other so that the optical coupling lens to be formed by the mold is centered coaxially with a light emitting/receiving point of the light emitting/receiving element.

4. An optical waveguide device produced by a production method as recited in claim 1, the optical waveguide device comprising:
    a light emitting/receiving element mounted on an upper surface of a board;
    a core body which seals the light emitting/receiving element, the core body having an optical waveguide insertion recess of tapered slit shape for insertion of an optical waveguide having a longitudinally extending core layer sandwiched between band-shaped films serving as cladding layers and unitarily combined with the films and an optical coupling lens unitarily formed in a portion thereof opposed to a light emitting/receiving surface of the light emitting/receiving element; and
    an optical waveguide having one end inserted in the recess of the core body and sealed with a resin to be fixed in the recess of the core body in a state where the one end of the optical waveguide being in contact with the optical coupling lens, and optically coupled with a light emitting/receiving point of the light emitting/receiving element in the core body.

5. An optical waveguide connection structure to be used for an optical waveguide device as recited in claim 4, the optical waveguide connection structure comprising:
    a core body which seals a light emitting/receiving element mounted on an upper surface of a board, the core body having an optical waveguide insertion recess of tapered slit shape for insertion of an optical waveguide having a longitudinally extending core layer sandwiched between band-shaped films serving as cladding layers and unitarily combined with the films and an optical coupling lens unitarily formed in a portion thereof opposed to a light emitting/receiving surface of the light emitting/receiving element;

wherein one end of an optical waveguide is inserted in the recess of the core body and sealed with a resin in a state where the one end of the optical waveguide being in contact with the optical coupling lens to be fixed in the recess of the core body, and the optical waveguide is optically coupled with the light emitting/receiving element in the core body.

* * * * *